US009336852B2

(12) United States Patent
Lim et al.

(10) Patent No.: US 9,336,852 B2
(45) Date of Patent: May 10, 2016

(54) MEMORY AND MEMORY SYSTEM INCLUDING THE SAME

(71) Applicant: SK hynix Inc., Gyeonggi-do (KR)

(72) Inventors: Yu-Ri Lim, Gyeonggi-do (KR); Jin-Hee Cho, Gyeonggi-do (KR); Jung-Hoon Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 1 day.

(21) Appl. No.: 14/333,300

(22) Filed: Jul. 16, 2014

(65) Prior Publication Data
US 2015/0206572 A1 Jul. 23, 2015

(30) Foreign Application Priority Data

Jan. 21, 2014 (KR) ........................ 10-2014-0007178

(51) Int. Cl.
G11C 7/00 (2006.01)
G11C 11/406 (2006.01)

(52) U.S. Cl.
CPC ........ *G11C 11/406* (2013.01); *G11C 11/40611* (2013.01); *G11C 11/40615* (2013.01)

(58) Field of Classification Search
CPC .............. G11C 7/00; G11C 11/40611; G11C 11/40615; G11C 11/406
USPC ............................................ 365/222, 189.07
See application file for complete search history.

(56) References Cited

U.S. PATENT DOCUMENTS

| 5,896,333 | A | 4/1999 | Nakashima et al. | |
| 7,362,640 | B2* | 4/2008 | Oh | G11C 11/406 365/189.07 |
| 9,129,672 | B2* | 9/2015 | Moon | G11C 19/00 |
| 2012/0307572 | A1 | 12/2012 | Yamaoka et al. | |
| 2014/0078845 | A1* | 3/2014 | Song | G11C 7/02 365/222 |
| 2014/0095786 | A1* | 4/2014 | Moon | G11C 11/4078 711/109 |
| 2014/0177376 | A1* | 6/2014 | Song | G11C 29/783 365/230.03 |
| 2014/0369109 | A1* | 12/2014 | Lee | G11C 11/406 365/149 |
| 2015/0043292 | A1* | 2/2015 | Lee | G11C 29/025 365/201 |
| 2015/0063049 | A1* | 3/2015 | Yang | G11C 11/406 365/222 |
| 2015/0089326 | A1* | 3/2015 | Joo | G06F 11/1016 714/767 |
| 2015/0155025 | A1* | 6/2015 | Lee | G11C 11/40618 365/222 |
| 2015/0162067 | A1* | 6/2015 | Kim | G11C 11/40611 365/222 |
| 2015/0170728 | A1* | 6/2015 | Jung | G11C 11/40611 365/222 |
| 2015/0170733 | A1* | 6/2015 | Lee | G11C 11/40615 365/222 |

* cited by examiner

*Primary Examiner* — Viet Q Nguyen
(74) *Attorney, Agent, or Firm* — IP & T Group LLP

(57) ABSTRACT

A memory includes a plurality of word lines, a measurement block suitable for measuring an active duration of an activated word line among the multiple word lines, and a refresh circuit suitable for controlling a refresh operation to refresh one or more of the multiple word lines adjacent to the activated word line when the active duration exceeds a predetermined threshold.

14 Claims, 5 Drawing Sheets

MEMORY AND MEMORY SYSTEM INCLUDING THE SAME

CROSS-REFERENCE TO RELATED APPLICATIONS

The present application claims priority of Korean Patent Application No. 10-2014-0007178, filed on Jan. 21, 2014, which is incorporated herein by reference in its entirety.

BACKGROUND

1. Field

Exemplary embodiments of the present invention relate to a memory and a memory system including the same.

2. Description of the Related Art

A memory cell of a memory includes a transistor serving as a switch and a capacitor storing a charge, which is data. Data is identified as logic high corresponding to logic '1' or logic low corresponding to logic '0' depending on charge accumulation in a capacitor of a memory cell—in other words, whether the terminal voltage level of the capacitor is high or low.

Theoretically, there is no data loss in the memory cell because the data is stored by way of charge accumulation in the capacitor. However, because of current leakage in the PN junction of the MOS transistor as well as other places, the initial charge accumulated in the capacitor may decrease, and consequently the data stored in the memory cell may be lost. To prevent data loss, the data stored in the memory cell is read and the charge has to be recharged according to the read data periodically before losing the stored data, which is called a refresh operation. The refresh operation allows the memory to keep the stored data without data loss.

FIG. 1 is a circuit diagram illustrating a portion of a cell array included in a memory. In FIG. 1, BL represents a bit line.

Referring to FIG. 1, three word lines WLK−1, WLK, and WLK+1 in the cell array are arranged in parallel. Furthermore, the K-th word line WLK with notation "HIGH_ACT" is an activated word line. The (K−1)th and (K+1)th word lines WLK−1 and WLK+1 are adjacent to the active K-th word line WLK. Furthermore, (K−1)th, K-th and (K+1)th memory cells CELL_K−1 CELL_K, and CELL_K+1 are electrically coupled to the (K−1)th, K-th and (K+1)th word lines WLK−1, WLK, and WLK+1, respectively. The (K−1)th, K-th and (K+1)th memory cells CELL_K−1 CELL_K and CELL_K +1 include (K−1)th, K-th and (K+1)th cell transistors TR_K−1, TR_K, and TR_K+1; and (K−1)th, K-th, and (K+1)th cell capacitors CAP_K−1, CAP_K and CAP_K+1, respectively.

When the K-th word line WLK is activated, the voltages of the adjacent (K−1)th and (K+1)th word lines WLK−1 and WLK+1 fluctuate from coupling between the K-th word line WLK and the adjacent (K−1)th and (K+1)th word lines WLK−1 and WLK+1, thereby influencing charges stored in the (K−1)th and (K+1)th cell capacitors CAP_K−1 and CAP_K+1, which is referred to as word line disturbance. In other words, the probability of data loss of the memory cells CELL_K−1 and CELL_K+1 of the adjacent word lines WLK−1 and WLK+1 increases, which becomes more severe as the activity of the active word line WLK becomes greater.

SUMMARY

Various embodiments of the present invention are directed to a memory and a memory system that prevents word line disturbance.

In accordance with an embodiment of the present invention, a memory may include a plurality of word lines, a measurement block suitable for measuring an active duration of an activated word line among the multiple word lines, and a refresh circuit suitable for controlling a refresh operation to refresh one or more of the multiple word lines adjacent to the activated word line when the active duration is measured to exceed a threshold.

The refresh circuit may control a first refresh operation to refresh one or more of the word lines adjacent to the activated word line in response to the refresh command when the active duration is measured to exceed the threshold.

Further, the refresh circuit may control the first refresh operation to be performed further to sequential refresh of the multiple word lines.

In accordance with another embodiment of the present invention, a memory may include a cell array including a plurality of word Ones; a command decoding block suitable for generating an active command, a precharge command and a refresh command by decoding a plurality of externally inputted command signals; a first active control block suitable for enabling a first row active signal in response to the active command, and disabling the first row active signal in response to the precharge command; a measurement block suitable for enabling a threshold signal when the duration of the enabled first row active signal exceeds a threshold value; a second active control block suitable for generating a second row active signal and a third row active signal in response to the refresh command and the threshold signal; an address generation block suitable for generating a counting address and an adjacent address in response to the refresh command and the threshold signal; and a row circuit suitable for activating one among the multiple word lines according to an externally inputted address when the first row active signal is enabled, activating one among the word lines according to the counting address when the second row active signal is enabled, and activating one among the word lines according to the adjacent address when the third row active signal is enabled.

The address generation block may include an address counter suitable for generating the counting address in response to the refresh command, a latch suitable for storing the externally inputted address in response to the enabled threshold signal, and an adjacent address generator suitable for generating the adjacent address designating one or more word lines adjacent to a word line corresponding to the address stored in the latch.

The second active control unit may enable the third row active signal during a predetermined period whenever the refresh command is enabled and the threshold signal is enabled.

Also, the second active control unit may further enable the second row active signal during a predetermined period so that the second row active signal and the third active signal are sequentially to enabled whenever the refresh command is enabled and the threshold signal is enabled.

In accordance with an embodiment of the present invention, a memory system may include a memory suitable for performing an activating and deactivating operation on a plurality of word lines in response to an active command, a precharge command, and a refresh command, and refreshing one or more word lines adjacent to an activated word line, having an active duration of which exceeds a threshold, and a memory controller which applies the active command, the precharge command, and the refresh command to the memory.

In accordance with an embodiment of the present invention, a memory may include a measurement unit suitable for generating a threshold signal based on whether an active duration of a first word line among a plurality of word lines is equal to or exceeds a threshold, and a refresh unit suitable for performing an adjacent refresh operation to refresh one or more of adjacent word lines to the first word line in response to the threshold signal, In accordance with an embodiment of the present invention, a memory may include a first active control block suitable for generating a first row active signal in response to an active command, a measurement block suitable for generating a threshold signal when a duration of the first row active signal exceeds a threshold, a second active control block suitable for generating a second row active signal in response to a refresh command and the threshold signal, an address generation block suitable for generating an adjacent address in response to the refresh command and the threshold signal, and a row circuit suitable for activating one or more word lines corresponding to the adjacent address in response to the second row active signal, wherein the adjacent address corresponds to a word line adjacent to a word line activated in response to the first row active

DETAILED DESCRIPTION

Hereafter, exemplary embodiments of the present invention are described below in more detail with reference to the accompanying drawings. These embodiments are provided so that this disclosure is thorough and complete, and fully convey the scope of the present invention to those skilled in the art.

Figure 2:
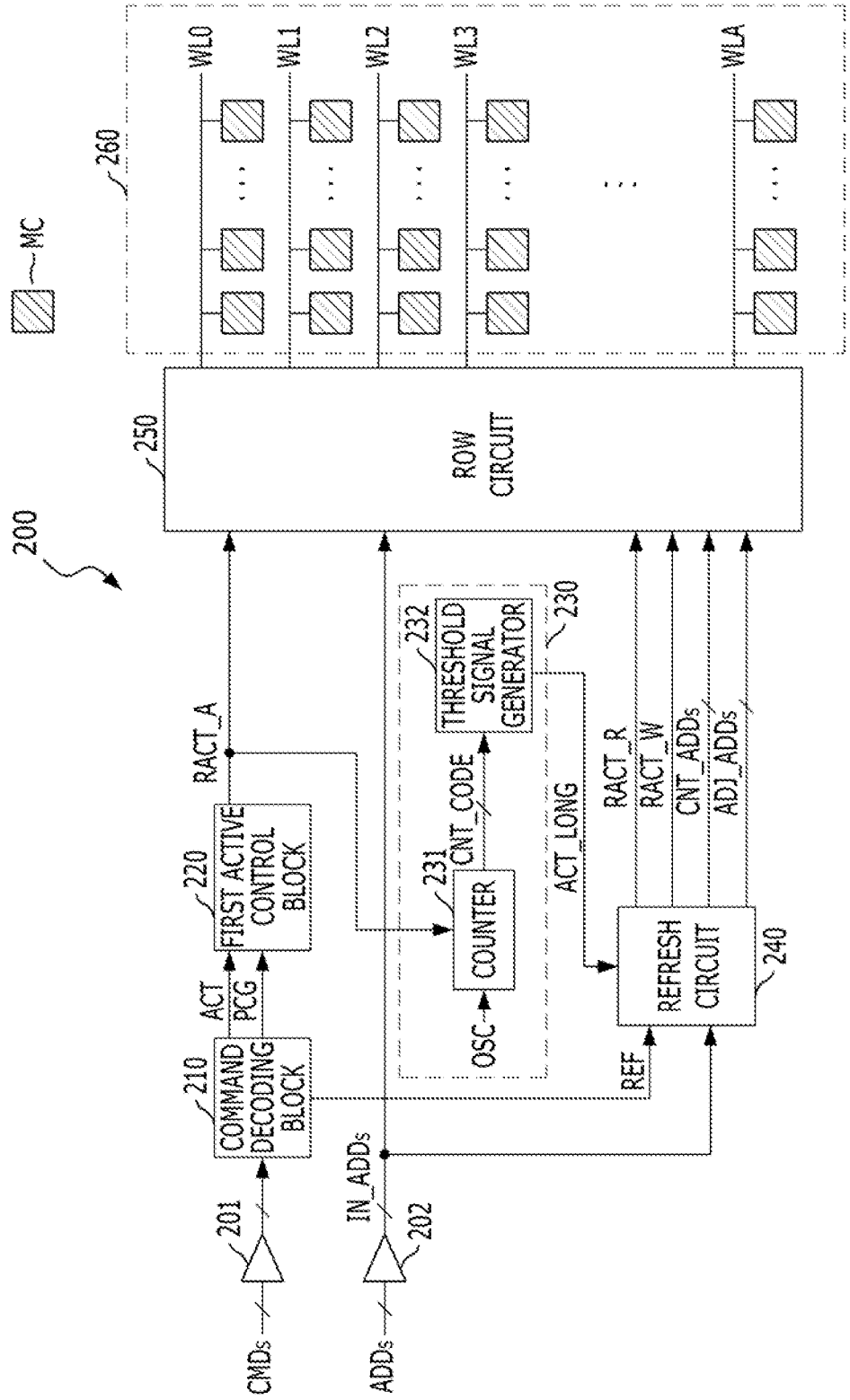
FIG. 2 is a block diagram illustrating a memory in accordance with an embodiment of the present invention.

FIG. 2 is a block diagram illustrating a memory 200 in accordance with an embodiment of the present invention.

Referring to FIG. 2, the memory 200 may include a command reception block 201, an address reception block 202, a command decoding block 210, a first active control block 220, a measurement block 230, a refresh circuit 240, a row circuit 250, and a cell array 260.

The cell array 260 may include a plurality of word lines WL0 to WLA, where A is a natural number. One or more memory cells MC may be coupled with the word lines WL0 to WLA. The word lines WL0 to WLA may be disposed in order of 0 to A.

The command reception block 201 may receive commands CMD, and the address reception block 202 may receive addresses ADD. The commands CMD and the addresses ADD may include one or more multi-bit signals, respectively.

The command decoding block 210 may generate one or more of an active command ACT, a precharge command PCG, and a refresh command REF by decoding the command signals CMD inputted through the command reception block 201. The command decoding block 210 may enable one or more of the active command ACT, the precharge command PCG, and the refresh command REF according to the combination of the inputted command signals CMD.

The row circuit 250 may control activation and deactivation of the word lines WL0 to WLA in response to a first row active signal RACT_A, which is a row active signal corresponding to the active command ACT, a second row active signal RACT_R, which is a row active signal corresponding to the refresh command REF, and a third row active signal RACT_W, which is a row active signal for activating an adjacent word line of a long-time-activated word line (a word line that has been activated for a time longer than a given threshold). The adjacent word line and the long-time-activated word line will be described later. The row circuit 250 may activate one or more of the word lines WL0 to WLA according to addresses IN_ADD, which are outputted from the address reception block 202 and correspond to the addresses ADD, while the first row active signal RACT_A, is enabled. The row circuit 250 may activate one or more of the word lines WL0 to WLA according to counting addresses CNT_ADD, which may be generated by the refresh circuit 240, while the second row active signal RACT_R is enabled. The row circuit 250 may activate one or more of the word lines WL0 to WLA according to adjacent addresses ADJ_ADD, which may be generated by the refresh circuit 240 and may represent the adjacent word lines of the long-time-activated word line, while the third row active signal RACT_W is enabled.

The first active control block 220 may enable the first row active signal RACT_A in response to the active command ACT, and disable the first row active signal RACT_A in response to the precharge command PCG. The first row active signal RACT_A is a signal for activating a word line represented by the addresses IN_ADD during an active operation. The duration of the enabled first row active signal RACT_A may correspond to the activation duration of a word line during the active operation.

The measurement block 230 may measure the activation duration of the word line during the active operation. The measurement block 230 may measure the activation duration of the word line by measuring the duration of the enabled first row active signal RACT_A. When the duration of the enabled first row active signal RACT_A is determined to exceed a threshold value, the measurement block 230 may enable a threshold signal ACT_LONG. A word line, the activation duration of which is too long (i.e. exceeds a threshold value), is referred to as the long-time-activated word line in this disclosure. The long-time-activated word line is activated according to the enabled first row active signal RACT_A, the duration of which may be determined to exceed a threshold value and thus the threshold signal ACT_LONG is enabled. The measurement block 230 to may include a counter 231 and a threshold signal generator 232. The counter 231 may generate a counting code CNT_CODE, which is a multi-bit signal, by counting the number of a predetermined states, which may be a logic low or high state for example, of a periodic wave OSC while the first row active signal RACT_A is enabled. The threshold signal generator 232 may enable the threshold signal ACT_LONG when a code value of the counting code CNT_CODE is equal to or greater than a predetermined value. A threshold value or a criterion for enabling the threshold signal ACT_LONG may depend on the periodic wave OSC and a predetermined value. For example, when the period of the periodic wave OSC is 1 μs, and the predetermined value is approximately 10, the threshold value may be 10 μs.

Figure 1:
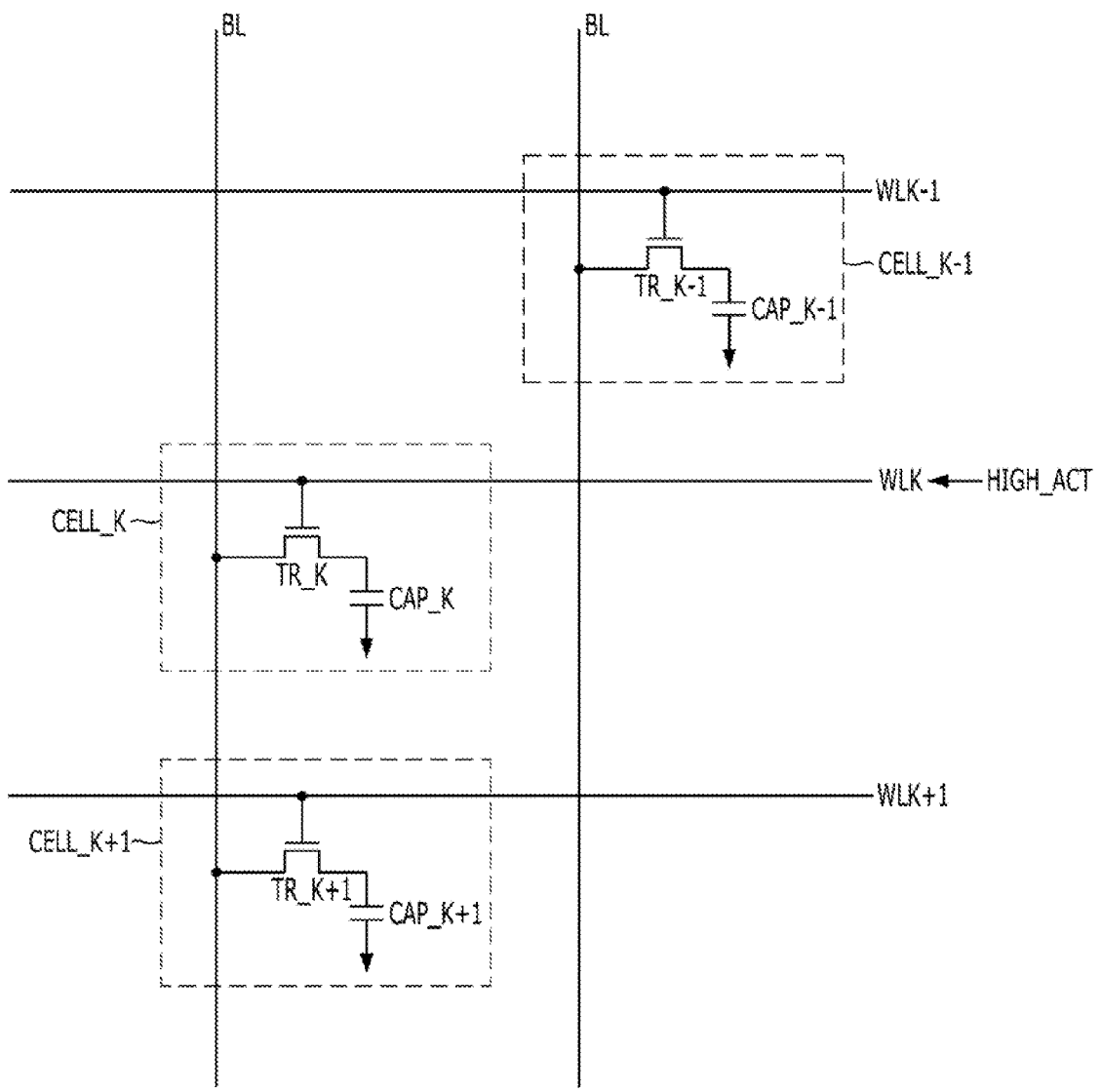
FIG. 1 is a circuit diagram illustrating a portion of a cell array included in a memory.

The refresh circuit 240 may control a sequential refresh operation to the word lines WL0 to WLA in response to the refresh command REF. Further, when the threshold signal ACT_LONG is enabled, the refresh circuit 240 may control an adjacent refresh operation to the adjacent word lines of the long-time-activated word line. For example, referring to FIG. 1, when the Kth word line WLK becomes the long-time-activated word line, the (K−1)th and (K+1)th word lines may be the adjacent word lines of the long-time-activated word line. The number of the adjacent word lines may be defined in various ways according to circuit design. The refresh circuit 240 may control the refresh operations in the manner of generating and applying the second row active signal RACT_R, the third row active signal RACT_W, the counting addresses CNT_ADD and the adjacent addresses ADJ_ADD to the row circuit 250.

As described above, the refresh circuit 240 may control the sequential refresh operation in response to the refresh command REF, the adjacent refresh operation in response to the refresh command REF, and the threshold signal ACT_LONG. The refresh circuit 240 may control the sequential refresh operation to sequentially activate the word lines WL0 to WLA in response to the enabled refresh command REF. Further, as an embodiment of the adjacent refresh operation, the refresh circuit 240 may control the adjacent refresh operation to additionally activate the adjacent word lines WLK−1 and WLK+1 of the long-time-activated word line WLK as well as sequentially activating the word lines WL0 to WLA in response to the enabled refresh command REF and the enabled threshold signal ACT_LONG. As another embodiment of the adjacent refresh operation, the refresh circuit 240 may control the adjacent refresh operation to activate the adjacent word lines WLK−1 and WLK+1 of the long-time-activated word line WLK without sequentially activating the word lines WL0 to WLA in response to the enabled refresh command REF and the enabled threshold signal ACT_LONG.

In other words, during the adjacent refresh operation, the adjacent word lines WLK−1 and WLK+1 to the long-time-activated word line WLK are refreshed with or without sequential refresh of the word lines WL0 to WLA in response to the enabled refresh command REF and the enabled threshold signal ACT_LONG.

Figure 3:
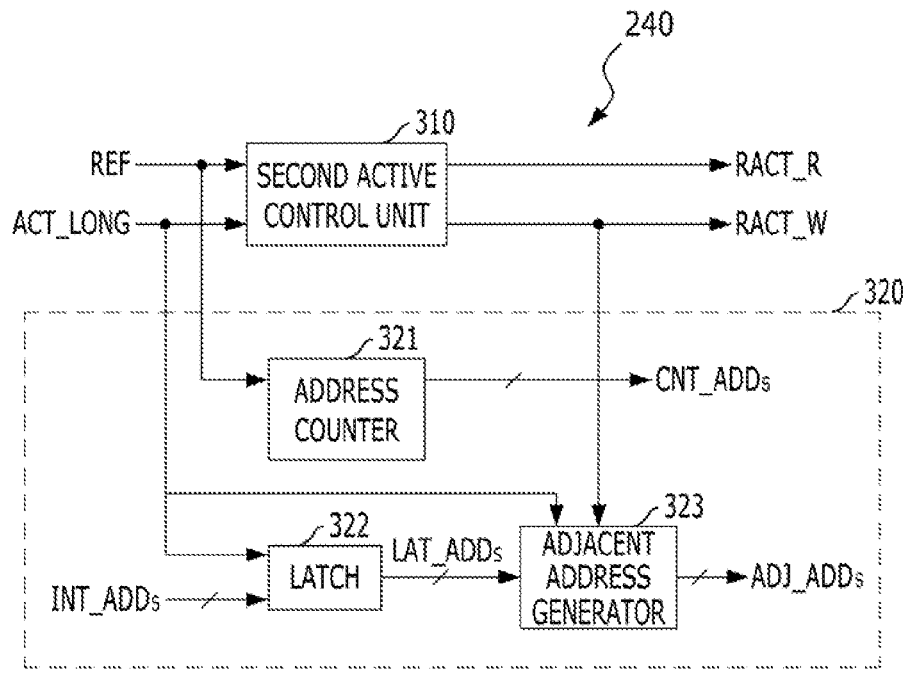
FIG. 3 is a block diagram exemplarily illustrating a refresh circuit shown in FIG. 2.

FIG. 3 is a block diagram exemplarily illustrating the refresh circuit 240 shown in FIG. 2. The refresh circuit 240 shown in FIG. 3 may control the adjacent refresh operation to activate the adjacent word lines WLK−1 and WLK+1 of the long-time-activated word line WLK by sequentially activating the word lines WL0 to WLA in response to the enabled refresh command REF and the enabled threshold signal ACT_LONG.

Referring to FIG. 3, the refresh circuit 240 may include a second active control unit 310 and an address generation unit 320.

The second active control unit 310 may generate the second row active signal RACT_R and the third row active signal RACT_W in response to the refresh command REF and the threshold signal ACT_LONG. The second active control unit 310 may enable the second row active signal RACT_R in response to the enabled refresh command REF during the sequential refresh operation. Further, the second active control unit 310 may sequentially enable the second row active signal RACT_R and the third row active signal RACT_W in response to the enabled refresh command REF and the enabled threshold signal ACT_LONG for two cycles of a refresh period when the refresh command REF is enabled twice during the adjacent refresh operation.

The address generation unit 320 may generate the counting addresses CNT_ADD in response to the refresh command REF, and the adjacent addresses ADJ_ADD in response to the threshold signal ACT_LONG. The address generation unit 320 may include an address counter 321, a latch 322 and an adjacent address generator 323.

The address counter 321 may change values of the counting addresses CNT ADD in response to the enabled refresh command REF. For example, the address counter 321 may increase the values of the counting addresses CNT_ADD by '1' whenever the refresh command REF is enabled.

The latch 322 may store the addresses IN_ADD, which are outputted from the address reception block 202, as latched addresses LAT_ADD in response to the enabled threshold signal ACT_LONG. The addresses LAT_ADD may correspond to the long-time-activated word line. The adjacent address generator 323 may generate the adjacent addresses ADJ_ADD based on the addresses LAT_ADD stored in the latch 322. While the threshold signal ACT_LONG is enabled, the adjacent address generator 323 may generate the adjacent addresses ADJ_ADD by subtracting '1' from and adding '1' to the value of the addresses LAT_ADD, which currently represent the long-time-activated word line, whenever the third row active signal RACT_W is enabled. Therefore, for example, a first adjacent word line WLK−1 of the long-time-activated word line WLK is refreshed in response to the firstly enabled third row active signal RACT_W, and a second adjacent word line WLK+1 of the long-time-activated word line WLK is refreshed in response to the secondly enabled third row active signal RACT_W. Herein, K is an integer ranging from 0 to A. When K is 0, K−1 may be A, and when K is A, K+1 may be 0.

Figure 4:
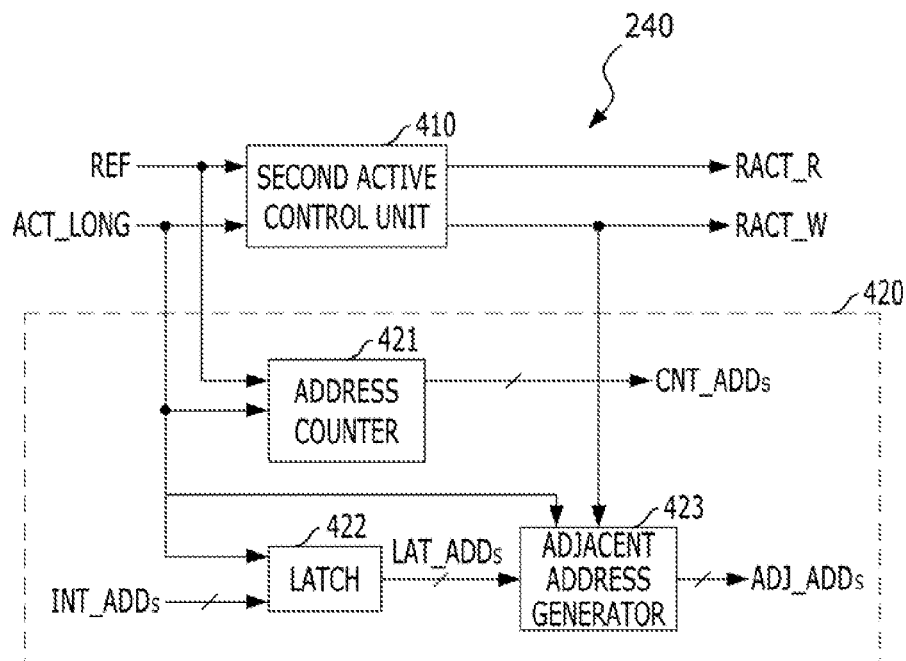
FIG. 4 is a block diagram exemplarily illustrating a refresh circuit shown in FIG. 2.

FIG. 4 is a block diagram exemplarily illustrating the refresh circuit 240 shown in FIG. 2. The refresh circuit 240 shown in FIG. 4 may control the adjacent refresh operation to activate the adjacent word lines WLK−1 and WLK+1 of the long-time-activated word line WLK without sequentially activating the word lines WL0 to WLA in response to the enabled refresh command REF and the enabled threshold signal ACT_LONG.

Referring to FIG. 4, the refresh circuit 240 may include a second active control unit 410 and an address generation unit 420.

The second active control unit 410 may generate the second row active signal RACT_R and the third row active signal RACT_W in response to the refresh command REF and the threshold signal ACT_LONG. The second active control unit 310 may enable the second row active signal RACT_R in response to the enabled refresh command REF during the sequential refresh operation. Further, the second active control unit 410 may enable the third row active signal RACT_W without enabling the second row active signal RACT_R in response to the enabled refresh command REF and the enabled threshold signal ACT_LONG for two cycles of the refresh period when the refresh command REF is enabled twice during the adjacent refresh operation.

The address generation unit 420 may generate the counting addresses CNT_ADD in response to the refresh command REF, and the adjacent addresses ADJ_ADD in response to the threshold signal ACT_LONG. The address generation unit 420 may include an address counter 421, a latch 422 and an adjacent address generator 423.

The address counter 421 may change values of the counting addresses CNT_ADD in response to the enabled refresh command REF. For example, the address counter 421 may increase the values of the counting addresses CNT_ADD by '1' whenever the refresh command REF is enabled. During the adjacent refresh operation, the address counter 421 may ignore enablement of the refresh command REF twice. In other words, during the adjacent refresh operation, the values of the counting addresses CNT_ADD may not change despite of the first and second enablement of the refresh command REF, and the values of the counting addresses CNT_ADD may change according to the third enablement of the refresh command REF.

The latch 422 and the adjacent address generator 423 may be the same as the latch 322 and the adjacent address generator 323 described above with reference to FIG. 3.

Figure 5:
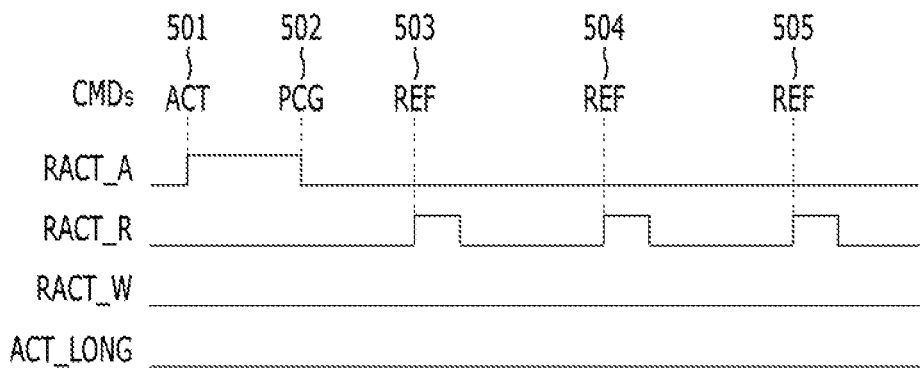
FIG. 5 is a timing diagram illustrating an operation of a memory in accordance with an embodiment of the present invention.

FIG. 5 is a timing diagram illustrating an operation of the memory 200 in accordance with an embodiment of the present invention. FIG. 5 shows the case when there is no long-time-activated word line and thus the threshold signal ACT_LONG is not enabled.

Referring to FIG. 5, the first row active signal RACT_A may be enabled in response to the active command ACT applied at a moment 501, and the first row active signal RACT_A may be disabled in response to the precharge command PCG applied at a moment 502. A word line activated according to the enabled first row active signal RACT_A may correspond to the addresses IN_ADD outputted from the address reception block 202 while the first row active signal RACT_A is enabled. When the duration of the enabled first row active signal RACT_A is less than the threshold value, the threshold signal ACT_LONG may not be enabled.

The second row active signal RACT_R may be firstly enabled in response to the refresh command REF applied at a moment 503. A word line, e.g., an Nth word line WLN, activated according to the firstly enabled second row active signal RACT_R may correspond to the counting addresses CNT_ADD generated during the sequential refresh operation.

The second row active signal RACT_R may be secondly enabled in response to the refresh command REF applied at a moment 504. A word line, e.g., an (N+1)th word line WLN+1 activated according to the secondly enabled second row active signal RACT_R may also correspond to the counting addresses CNT_ADD generated during the sequential refresh operation. Since the Nth word line WLN is activated in the sequential refresh operation of the moment 503, the (N+1)th word line WLN+1 is sequentially activated in the sequential refresh operation of the moment 504. Similarly, an (N+2)th word line WLN+2 is sequentially activated in the sequential refresh operation of a moment 505.

Figure 6:
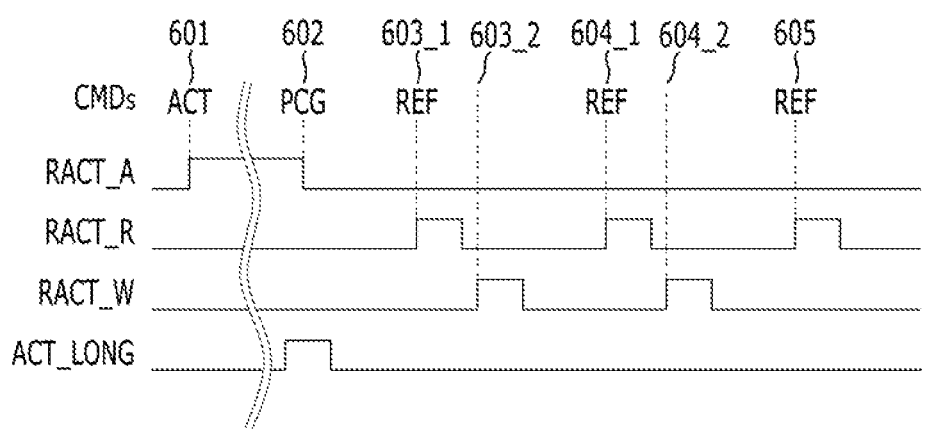
FIG. 6 is a timing diagram illustrating an operation of a memory having a refresh circuit shown in FIG. 3.
Figure 7:
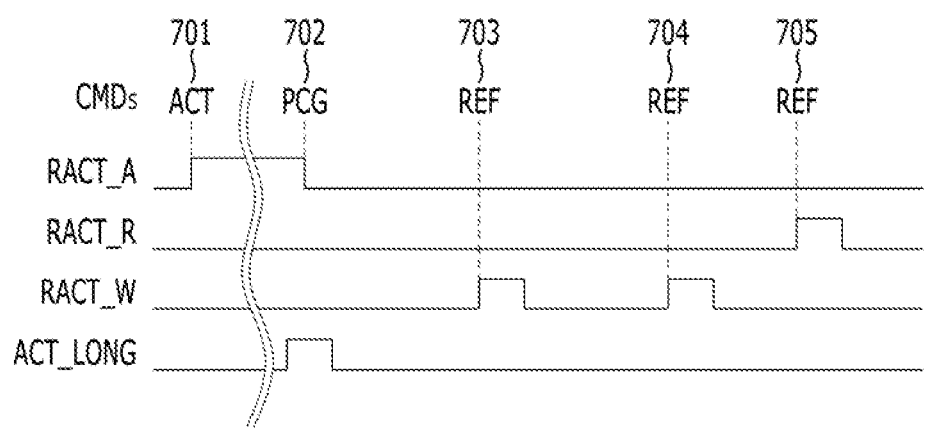
FIG. 7 is a timing diagram illustrating an operation of a memory having a refresh circuit shown in FIG. 4.

The following FIGS. 6 and 7 show an example where the threshold signal ACT_LONG is enabled according to the long-time-activated word line, and thus the adjacent refresh operation may be performed in accordance with an embodiment of the present invention.

FIG. 6 is a timing diagram illustrating an operation of the memory 200 having the refresh circuit 240 shown in FIG. 3. As an embodiment of the adjacent refresh operation, the refresh circuit 240 may control the adjacent refresh operation to activate the adjacent word lines WLK−1 and WLK+1 of the long-time-activated word line WLK by sequentially activating the word lines WL0 to WLA in response to the enabled refresh command REF and the enabled threshold signal ACT_LONG.

Referring to FIG, 6, the first row active signal RACT_A may be enabled in response to the active command ACT applied at a moment 601, and the first row active signal RACT_A may be disabled in response to the precharge command PCG applied at a moment 602. A word line, e.g., a Kth word line WLK activated according to the enabled first row active signal RACT_A may correspond to the addresses IN_ADD outputted from the address reception block 202 while the first row active signal RACT_A is enabled. When the duration of the enabled first row active signal RACT_A is equal to or greater than the threshold value, the threshold signal ACT_LONG may be enabled. Accordingly, the Kth word line WLK may be the long-time-activated word line.

The second row active signal RACT_R may be firstly enabled in response to the refresh command REF applied at a moment 603_1. A word line, e.g., an Nth word line WLN activated according to the firstly enabled second row active signal RACT_R may correspond to the counting addresses CNT_ADD generated during the adjacent refresh operation. Subsequently, the third row active signal RACT_W may be firstly enabled at a moment 603_2. A word line, e.g., a (K−1)th word line WLK−1 activated according to the firstly enabled third row active signal RACT_W may correspond to the adjacent addresses ADJ_ADD generated during the adjacent refresh operation.

The second row active signal RACT_R may be secondly enabled in response to the refresh command REF applied at a moment 604_1. A word line, e.g., an (N+1)th word fine WLN+1 activated according to the secondly enabled second row active signal RACT_R may correspond to the counting addresses CNT_ADD generated during the adjacent refresh operation. Subsequently, the third row active signal RACT_W may be secondly enabled at a moment 604_2. A word line, e.g., a (K+1)th word line WLK+1 activated according to the secondly enabled third row active signal RACT_W may correspond to the adjacent addresses ADJ_ADD generated during the adjacent refresh operation.

The second row active signal RACT_R may be thirdly enabled in response to the refresh command REF applied at a moment 605. A word line, e.g., an (N+2)th word line WLN+2 activated according to the thirdly enabled second row active signal RACT_R may correspond to the counting addresses CNT_ADD generated during the adjacent refresh operation. As an example, since the adjacent refresh operation of the adjacent word lines WLK−1 and WLK+1 to the long-time-activated word line WLK is completed at the moment 6042, the third row active signal RACT_W may not be enabled after the thirdly enabled second row active signal RACT_R.

FIG. 7 is a timing diagram illustrating an operation of the memory 200 having the refresh circuit 240 shown in FIG. 4. As another embodiment of the adjacent refresh operation, the refresh circuit 240 may control the adjacent refresh operation to activate the adjacent word lines WLK−1 and WLK+1 of the long-time-activated word fine WLK without sequentially activating the word lines WL0 to WLA in response to the enabled refresh command REF and the enabled threshold signal ACT_LONG.

Referring to FIG. 7, the first row active signal RACT_A may be enabled in response to the active command ACT applied at a moment 701, and the first row active signal RACT_A may be disabled in response to the precharge command PCG applied at a moment 702. A word line, e.g., a Kth word line WLK activated according to the enabled first row active signal RACT_A may correspond to the addresses IN_ADD outputted from the address reception block 202 while the first row active signal RACT_A is enabled. When the duration of the enabled first row active signal RACT_A is equal to or greater than the threshold value, the threshold signal ACT_LONG may be enabled. Accordingly, the Kth word line WLK may be the long-time-activated word line.

As described above, during the adjacent refresh operation, the values of the counting addresses CNT_ADD may not change despite of the first and second enablement of the refresh command REF, and the values of the counting addresses CNT_ADD may change according to the third enablement of the refresh command REF, which means that the refresh circuit 240 may ignore the first and second enablement of the refresh command REF, and thus may not generate the second row active signal RACT_R in response to the first and second enablement of the refresh command REF. Instead, the refresh circuit 240 may generate the third row active signal RACT_W in response to the first and second enablement of the refresh command REF.

The third row active signal RACT_W may be firstly enabled instead of the second row active signal RACT_R in response to the refresh command REF firstly applied at a moment 703. A word line, e.g., a (K−1)th word line WLK−1 activated according to the firstly enabled third row active signal RACT_W may correspond to the adjacent addresses ADJ_ADD generated during the adjacent refresh operation.

Also, the third row active signal RACT_W may be secondly enabled instead of the second row active signal RACT_R in response to the refresh command REF secondly applied at a moment 704. A word line, e.g., a (K+1)th word line WLK+1 activated according to the secondly enabled third row active signal RACT_W may correspond to the adjacent addresses ADJ_ADD generated during the adjacent refresh operation.

The second row active signal RACT_R may be firstly enabled in response to the refresh command REF thirdly applied at a moment 705. A word line, e.g., an Nth word line WLN activated according to the firstly enabled second row active signal RACT_R may correspond to the counting addresses CNT_ADD generated during the adjacent refresh operation. As an example, since the adjacent refresh operation to the adjacent word lines WLK−1 and WLK+1 of the long-time-activated word line WLK is completed at the moment 704, the third row active signal RACT_W may not be enabled after the firstly enabled second row active signal RACT_R.

In accordance with the embodiments of the present invention, data stored in the memory cells of the adjacent word lines WLK−1 and WLK+1 may be prevented from being lost due to word line disturbance by refreshing the adjacent word lines WLK−1 and WLK+1 of the long-time-activated word line WLK, which has activated for a long time.

Figure 8:
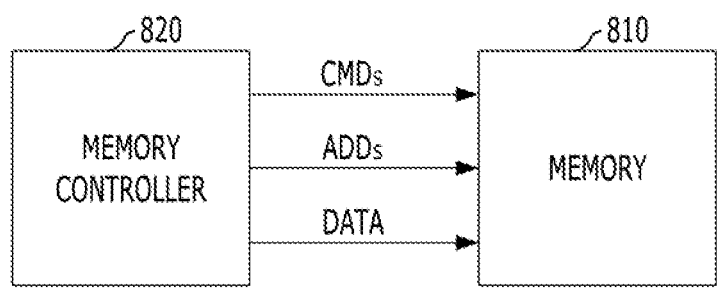
FIG. 8 is a block diagram illustrating a memory system in accordance with an embodiment of the present invention.

FIG. 8 is a diagram illustrating a memory system in accordance with an embodiment of the present invention.

Referring to FIG. 8, the memory system may include a memory 810 and a memory controller 820.

The memory controller 820 may control an operation of the memory 810 by applying commands CMD and addresses ADD to the memory 810, and exchange data with the memory 810 during a read operation and a write operation. The memory controller 820 may Input an active command ACT, a precharge command PCG and a refresh command REF to the memory 810 by transmitting the command signals CMD. When the memory controller 820 inputs the active command ACT to the memory 810, the memory controller 820 may transmit the addresses ADD for selecting a word line to be activated in the memory 810. Also, the memory controller 820 may periodically transmit the refresh command REF to the memory 810

The memory 810 may be one among the memories 200 described with reference to FIGS. 2 to 7. When a word line WLK is determined to be a long-time-activated word line by the measurement block 230 inside the memory 810, the memory 810 refreshes the adjacent word lines WLK−1 and WLK+1 of the long-time-activated word line WLK so that data stored in cell arrays of the adjacent word lines WLK−1 and WLK+1 may be prevented from being lost due to word line disturbance.

In accordance with the embodiments of the present invention, word line disturbance to adjacent word lines of a long-time-activated word line may be prevented, While the present invention has been described with respect to specific embodiments, it is noted that the embodiments of the present invention are not restrictive but descriptive. Further, it is noted that the present invention may be achieved in various ways through substitution, change, and modification, by those skilled in the art without departing from the scope of the present invention as defined by the following claims.

What is claimed is:

1. A memory, comprising:
   a plurality of word lines;
   a measurement block suitable for measuring an active duration of an activated word line among the multiple word lines; and
   a refresh circuit suitable for controlling a refresh operation to refresh one or more of the multiple word lines adjacent to the activated word line when the active duration is measured to exceed a threshold.

2. The memory of claim 1, wherein the refresh circuit controls a first refresh operation to refresh one or more of the word lines adjacent to the activated word line, in response to the refresh command, when the active duration is measured to exceed the threshold.

3. The memory of claim 2, wherein the refresh circuit controls the first refresh operation to be performed in addition to a sequential refresh of the multiple word lines.

4. The memory of claim 1, wherein the measurement block includes:
   a counter suitable for counting the number of times that a periodic wave reaches a predetermined state during an enabling section of a row active signal; and
   a threshold signal generator suitable for enabling a threshold signal allowing the refresh circuit to control the refresh operation when the number of times is equal to or greater than a predetermined value.

5. A memory, comprising:
   a cell array including a plurality of word lines;
   a command decoding block suitable for generating an active command, a precharge command and a refresh command by decoding a plurality of externally inputted command signals;
   a first active control block suitable for enabling a first row active signal in response to the active command, and disabling the first row active signal in response to the precharge command;
   a measurement block suitable for enabling a threshold signal when a duration of the enabled first row active signal exceeds a threshold value;
   a second active control block suitable for generating a second row active signal and a third row active signal in response to the refresh command and the threshold signal;
   an address generation block suitable for generating a counting address and an adjacent address in response to the refresh command and the threshold signal; and
   a row circuit suitable for activating one among the multiple word lines according to an externally inputted address when the first row active signal is enabled, activating one among the word lines according to the counting address when the second row active signal is enabled, and activating one among the word lines according to the adjacent address when the third row active signal is enabled.

6. The memory of claim 5, wherein the address generation block includes:
   an address counter suitable for generating the counting address in response to the refresh command;
   a latch suitable for storing the externally inputted address in response to the enabled threshold signal; and
   an adjacent address generator suitable for generating the adjacent address designating one or more word lines adjacent to a word line corresponding to the address stored in the latch.

7. The memory of claim 5, wherein the second active control block enables the third row active signal during a predetermined period whenever the refresh command is enabled and the threshold signal is enabled.

8. The memory of claim 7, wherein the second active control block further enables the second row active signal during a predetermined period so that the second row active signal and the third active signal are sequentially enabled whenever the refresh command is enabled and the threshold signal is enabled.

9. The memory of claim 5, wherein the measurement block includes:
   a counter suitable for counting the number of times that a periodic wave reaches a predetermined state during the enabling section of the first row active signal; and
   a threshold signal generator suitable for enabling the threshold signal when a counting value of the counter is equal to or greater than a predetermined value.

10. A memory system, comprising:
    a memory suitable for performing an activating and deactivating operation to a plurality of word lines in response to an active command, a precharge command and a refresh command, and refreshing one or more adjacent word lines adjacent to an activated word line, an active duration of which exceeds a threshold; and
    a memory controller which applies the active command, the precharge command and the refresh command to the memory.

11. The memory system of claim 10, wherein the memory includes:
    a measurement block suitable for measuring the active duration of the activated word line; and
    a refresh circuit suitable for controlling a refresh operation to refresh the adjacent word lines when the active duration is measured to exceed the threshold.

12. The memory system of claim 11, wherein the refresh circuit controls a first refresh operation to refresh the adjacent word lines in response to the refresh command when the active duration is measured to exceed the threshold.

13. The memory system of claim 12, wherein the refresh circuit controls the first refresh operation to be performed further to sequential refresh of the multiple word lines.

14. The memory system of claim 11, wherein the measurement block includes:
    a counter suitable for counting the number of times that a periodic wave reaches a predetermined state during the enabling section of the first row active signal; and
    a threshold signal generator suitable for enabling a threshold signal allowing the refresh circuit to control the refresh operation when a counting value of the counter is equal to or greater than a predetermined value.

* * * * *